United States Patent
Oh et al.

(10) Patent No.: US 8,407,655 B2
(45) Date of Patent: Mar. 26, 2013

(54) FIXING DESIGN REQUIREMENT VIOLATIONS IN MULTIPLE MULTI-CORNER MULTI-MODE SCENARIOS

(75) Inventors: Nahmsuk Oh, Palo Alto, CA (US); Rupesh Nayak, San Ramon, CA (US); William Chiu-Ting Shu, Palo Alto, CA (US)

(73) Assignee: Synopsys, Inc., Mountain View, CA (US)

( * ) Notice: Subject to any disclaimer, the term of this patent is extended or adjusted under 35 U.S.C. 154(b) by 161 days.

(21) Appl. No.: 12/949,689

(22) Filed: Nov. 18, 2010

(65) Prior Publication Data
US 2012/0131525 A1 May 24, 2012

(51) Int. Cl.
*G06F 17/50* (2006.01)
(52) U.S. Cl. ......... 716/134; 716/106; 716/108; 716/113
(58) Field of Classification Search .................. 716/106, 716/108, 110, 111, 132, 139, 113, 134
See application file for complete search history.

(56) References Cited

U.S. PATENT DOCUMENTS

| | | | |
|---|---|---|---|
| 5,018,215 A * | 5/1991 | Nasr et al. ..................... | 382/155 |
| 7,331,028 B2 * | 2/2008 | Dinter et al. .................. | 716/113 |
| 7,454,731 B2 * | 11/2008 | Oh et al. ....................... | 716/113 |
| 7,921,390 B2 * | 4/2011 | Archambeault et al. ...... | 716/106 |
| 7,962,876 B2 * | 6/2011 | Oh et al. ....................... | 716/113 |
| 2006/0026546 A1 | 2/2006 | Dinter et al. | |
| 2008/0066042 A1 | 3/2008 | Archambeault et al. | |
| 2009/0055787 A1 | 2/2009 | Oh et al. | |
| 2010/0153897 A1 | 6/2010 | Zahn | |

* cited by examiner

*Primary Examiner* — Sun Lin
(74) *Attorney, Agent, or Firm* — Park, Vaughan, Fleming & Dowler LLP; Laxman Sahasrabuddhe

(57) ABSTRACT

Systems and techniques for fixing design requirement violations in a circuit design in multiple scenarios are described. During operation, a system can receive a scenario image and a multi-scenario ECO database. The scenario image can store parameter values for circuit objects in a scenario, and the multi-scenario ECO database can store a subset of parameter values for a subset of circuit objects in multiple scenarios. Next, the system can determine an engineering change order to fix one or more design requirement violations, which can involve estimating parameter values for circuit objects in multiple scenarios using parameter values stored in the scenario image and the multi-scenario ECO database.

24 Claims, 5 Drawing Sheets

TABLE 500

|  | PARAMETER P1 | PARAMETER P2 | ••• | PARAMETER Pm |
|---|---|---|---|---|
| SCENARIO S1 | V-501 | V-502 | ••• | V-503 |
| SCENARIO S2 | V-504 | V-505 | ••• | V-506 |
| ⋮ | ⋮ | ⋮ | ⋮ | ⋮ |
| SCENARIO Sn | V-507 | V-508 | ••• | V-509 |

FIXING DESIGN REQUIREMENT VIOLATIONS IN MULTIPLE MULTI-CORNER MULTI-MODE SCENARIOS

BACKGROUND

1. Technical Field

This disclosure relates to electronic design automation (EDA). More specifically, this disclosure relates to systems and techniques for fixing design requirement violations in multiple multi-corner multi-mode scenarios.

2. Related Art

Rapid advances in computing technology have made it possible to perform trillions of computational operations each second on data sets that are sometimes as large as trillions of bytes. These advances can be largely attributed to the exponential increase in the size and complexity of integrated circuits.

To ensure that a manufactured chip will perform as desired, the circuit design is usually checked for compliance with a large number of design requirements. In fact, a circuit design is typically not manufactured until it satisfies the design requirements which can include, but are not limited to, timing requirements, noise requirements, leakage requirements, etc.

In a typical circuit design flow, a compliance checking tool is used to identify design requirement violations in a circuit design. Incremental adjustments are then made to the circuit design to fix the design requirement violations. Once the circuit design is violation free, the circuit design can be readied for manufacturing.

The advance to smaller semiconductor geometries has increased the variability in process and operating conditions of integrated circuits. A process corner is a particular set of process conditions under which the circuit design may be manufactured. An operating corner is a particular set of operating conditions (e.g., temperature, voltage) under which the circuit design may operate.

One reason for the increase in complexity of circuit designs is the introduction of a large number of operating modes (e.g., stand-by, mission, test, etc.). Specifically, some parts of the circuit design may be completely switched off in certain operating modes. Further, different operating modes can have drastically different voltages, clock speeds, etc.

It is desirable to ensure that a circuit design meets the functional and performance goals under all combinations of process corners, operating conditions, and/or operating modes. The term "Multi-Corner/Multi-Mode (MCMM) scenario," or "scenario" for short, refers to a combination of a particular process corner, a particular operating condition, and/or a particular operating mode.

Fixing a design requirement violation in one scenario may create new violations in other scenarios. Hence, the process of identifying and fixing violations typically needs to be performed multiple times and across multiple scenarios. Unfortunately, the amount of time required to fix design requirement violations is increasing rapidly because the size and complexity of circuit designs is increasing rapidly and because the number of scenarios over which circuit designs need to be checked is increasing rapidly.

SUMMARY

One embodiment of the present invention provides a system that fixes design requirement violations in a circuit design in multiple scenarios. During operation, the system can receive a scenario image and a multi-scenario engineering change order (ECO) database. The scenario image can store parameter values for circuit objects in a scenario, and the multi-scenario ECO database can store a subset of parameter values for a subset of circuit objects in multiple scenarios. Each scenario can be associated with one or more of: a process corner, an operating condition, or an operating mode. Next, the system can determine an ECO to fix one or more design requirement violations, which can involve estimating parameter values for circuit objects in multiple scenarios based on parameter values stored in the scenario image and the multi-scenario ECO database. In this disclosure, unless otherwise stated, the phrase "based on" means "based solely or partly on."

The parameter values can include circuit information that can enable the system to identify and fix design requirement violations. Specifically, the parameter values can include, but are not limited to, (1) timing slack values at one or more pins in the circuit design, (2) capacitive load values at one or more pins in the circuit design, (3) transition time values at one or more pins in the circuit design, and (4) leakage power values for gates in the circuit design.

The design requirement violations can help identify potential problems in the circuit design. Specifically, the design requirement violations can include, but are not limited to, (1) setup timing violations, (2) hold timing violations, (3) electrical design rule violations, and (4) power budget violations.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Figure 1:
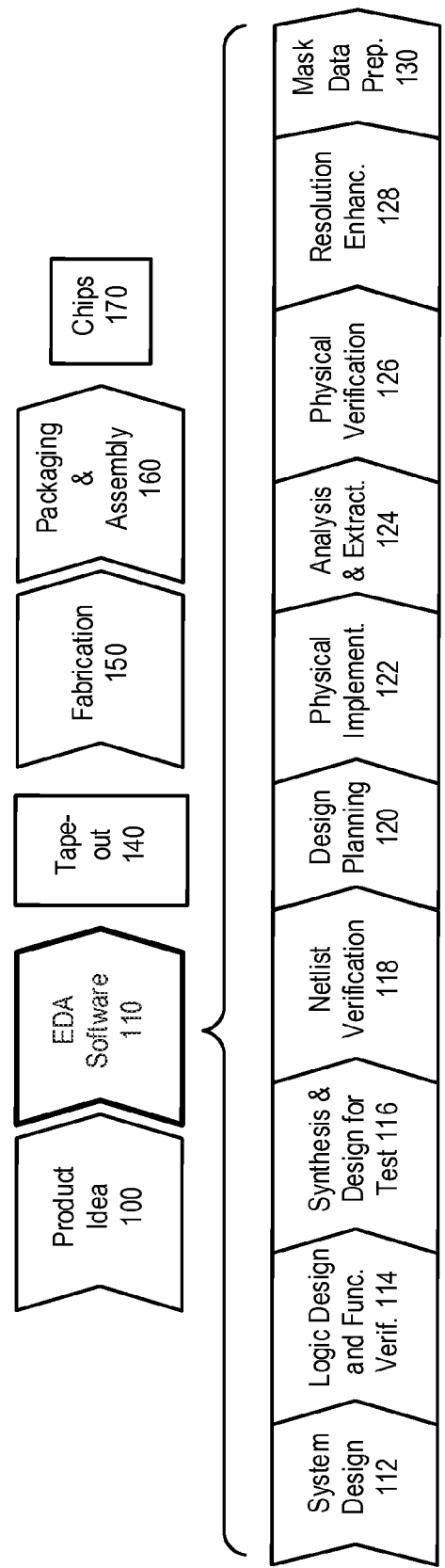
FIG. 1 illustrates various steps in the design and fabrication of an integrated circuit.

FIG. 1 illustrates various steps in the design and fabrication of an integrated circuit. The process starts with a product idea 100, which is realized using Electronic Design Automation (EDA) software 110. Chips 170 can be produced from the finalized design by performing fabrication 150 and packaging and assembly 160 steps.

A design flow that uses EDA software 110 is described below. Note that the design flow description is for illustration purposes only, and is not intended to limit the present invention. For example, an actual integrated circuit design may require a designer to perform the design flow steps in a different sequence than the sequence described below.

In the system design step 112, the designers can describe the functionality to implement. They can also perform what-if planning to refine the functionality and to check costs. Further, hardware-software architecture partitioning can occur at this step. In the logic design and functional verification step 114, a Hardware Description Language (HDL) design can be created and checked for functional accuracy.

In the synthesis and design step 116, the HDL code can be translated to a netlist, which can be optimized for the target technology. Further, tests can be designed and implemented to check the finished chips. In the netlist verification step 118, the netlist can be checked for compliance with timing constraints and for correspondence with the HDL code.

In the design planning step 120, an overall floor plan for the chip can be constructed and analyzed for timing and top-level routing. Next, in the physical implementation step 122, placement and routing can be performed.

In the analysis and extraction step 124, the circuit functionality can be verified at a transistor level. In the physical verification step 126, the design can be checked to correct any functional, manufacturing, electrical, or lithographic issues.

In the resolution enhancement step 128, geometric manipulations can be performed on the layout to improve manufacturability of the design. Finally, in the mask data preparation step 130, the design can be taped-out 140 for production of masks to produce finished chips.

Once design requirement violations are identified in a circuit design, cells in the circuit can be adjusted to fix the design requirement violations. For example, to fix a setup time violation, one or more cells in a path can be sized-up to decrease the delay experienced by a signal that traverses the path. Similarly, to fix a hold time violation, one or more buffers can be added to a path to increase the hold time at a pin in the path.

The incremental adjustments that are made to cells in the circuit to fix design requirement violations are called engineering change orders (ECOs). Note that ECOs are not limited to fixing timing violations. ECOs can generally be used to fix any kind of violation, e.g., design requirement check violations, noise violations, leakage violations, etc.

Figure 2A:
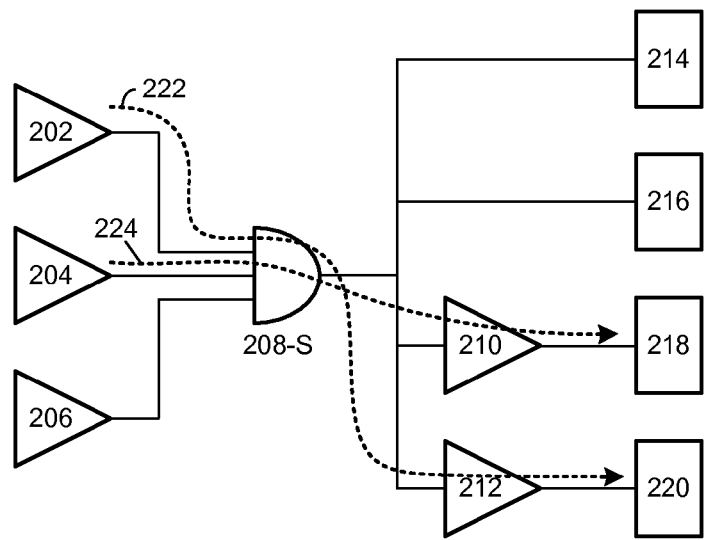
FIGS. 2A and 2B illustrate how fixing a design requirement violation in a scenario can create or worsen another design requirement violation in another scenario.
Figure 2B:
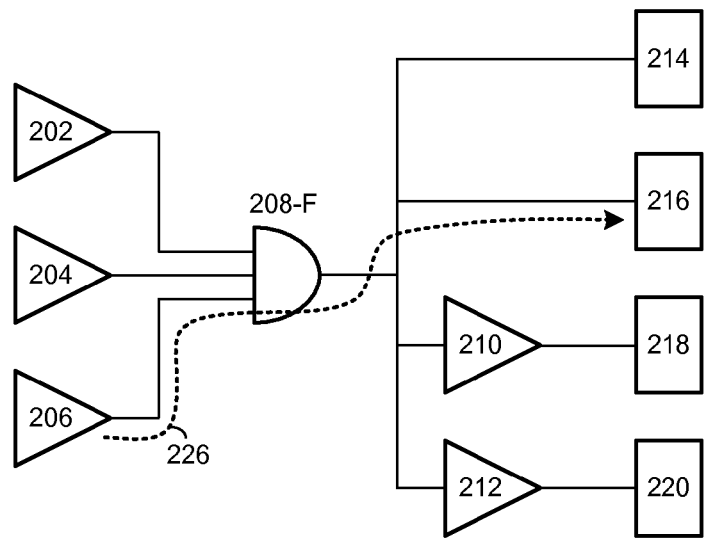

FIGS. 2A and 2B illustrate how fixing a design requirement violation in a scenario can create or worsen another design requirement violation in another scenario.

Gates 202-220 can be part of a circuit design. As illustrated in FIG. 2A, the circuit design may have setup timing violations along paths 222 and 224 in scenario S1. If we only consider scenario S1, gate 208-S is a good candidate to apply an ECO to fix the timing violations. Specifically, gate 208-S may be replaced with a faster gate (i.e., a gate with a smaller delay value) to fix the setup timing violations along paths 222 and 224.

However, as shown in FIG. 2B, replacing gate 208-S with a faster gate may create or worsen a hold timing violation along path 226 in scenario S2. Specifically, FIG. 2B shows that gate 208-S has been replaced with gate 208-F, which is a faster version of gate 208-S. When gate 208-S was replaced with gate 208-F, it fixed the setup violations along paths 222 and 224 in scenario S1, but created or worsened a hold violation along path 226 in scenario S2.

For these reasons, a system (e.g., a computer system executing an EDA tool) needs to check multiple scenarios when fixing design requirement violations. In FIGS. 2A and 2B, if the system checks both scenarios S1 and S2 when fixing design requirement violations, the system can select gates 202, 204, and 212 as candidates for applying ECOs. For example, the system can replace gates 202 and 204 with faster gates, and replace gate 212 with a slower gate, thereby fixing setup timing violations along paths 222 and 224 in scenario S1 and at the same time fixing hold timing violations along path 226 in scenario S2. Similar considerations also apply when other types of violations are being fixed.

Figure 3:
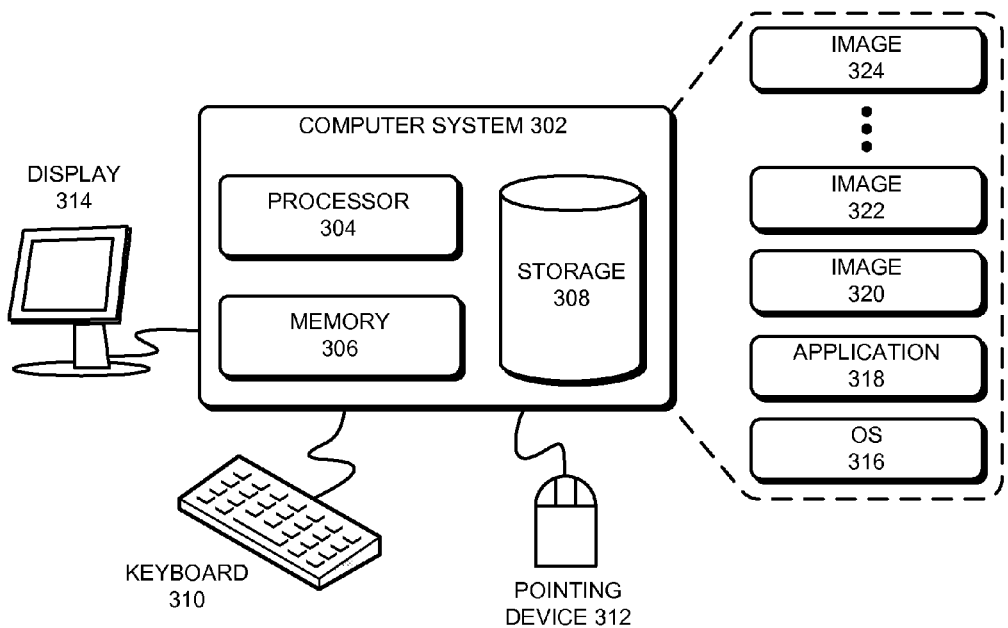
FIG. 3 illustrates an approach for fixing design requirement violations in multiple scenarios.

FIG. 3 illustrates an approach for fixing design requirement violations in multiple scenarios.

Computer system 302 can include processor 304, memory 306, and storage device 308. Computer system 302 can be coupled to display device 314, keyboard 310, and pointing device 312. Storage device 308 can store operating system 316, application 318, and scenario images 320-324 that correspond to different scenarios. Scenario images 320-324 can contain information that is required by application 318 to detect and/or fix design requirement violations in a circuit design in a particular scenario. Since each scenario image is typically very large, computer system 302 may only be able to hold one scenario image in memory 306 at any given time.

During operation, application 318 may load a scenario image corresponding to a particular scenario, e.g., scenario image 320 corresponding to scenario S1, from storage 308 into memory 306. Next, application 318 may use scenario image 320 to determine ECOs to fix design requirement violations in scenario S1. Application 318 can then remove scenario image 320 from memory 306, and load scenario image 322, which may correspond to scenario S2, from storage 308 to memory 306. Next, application 318 can use scenario image 322 to check whether the ECOs that were determined to fix design requirement violations in scenario S1 create new design requirement violations or worsen existing design requirement violations in scenario S2. If so, application 318 may reject the ECOs and start over by determining a new set of ECOs in scenario S1. On the other hand, if no new design requirement violations were created and no existing design requirement violations were worsened in scenario S2, the system may load the next scenario image corresponding to the next scenario. In this manner, the system may continue checking the ECOs in each scenario, and once the ECOs have been checked in all scenarios, the system may commit the ECOs to the circuit design.

Unfortunately, it usually takes a long time to load a scenario image from storage 308 to memory 306 because of the high latencies of disk operations. As a result, the above approach may take an impracticably long time to fix design requirement violations in multiple scenarios. A distributed computing-based approach may be used to improve performance. For example, each scenario image may be loaded into a separate computer in a distributed computing environment. Now, when a computer determines an ECO for a particular scenario, the computer can communicate the ECO to other computers in the distributed computing environment to verify the ECO in different scenarios. Unfortunately, this approach can be very costly because it may require a large number of computers if the number of scenarios is large, e.g., in the hundreds.

Some embodiments of the present invention can substantially reduce the amount of time required to determine ECOs for fixing design requirement violations in multiple scenarios. Some embodiments create a multi-scenario ECO database that includes information from all scenarios. This database is small enough so that it can reside in memory alongside a scenario image. When the system determines a set of ECOs for fixing design requirement violations in a particular scenario, the system can use the multi-scenario ECO database to check the ECOs across all scenarios. The multi-scenario ECO database enables the system to quickly estimate the impact that an ECO is expected to have in each scenario.

Figure 4:
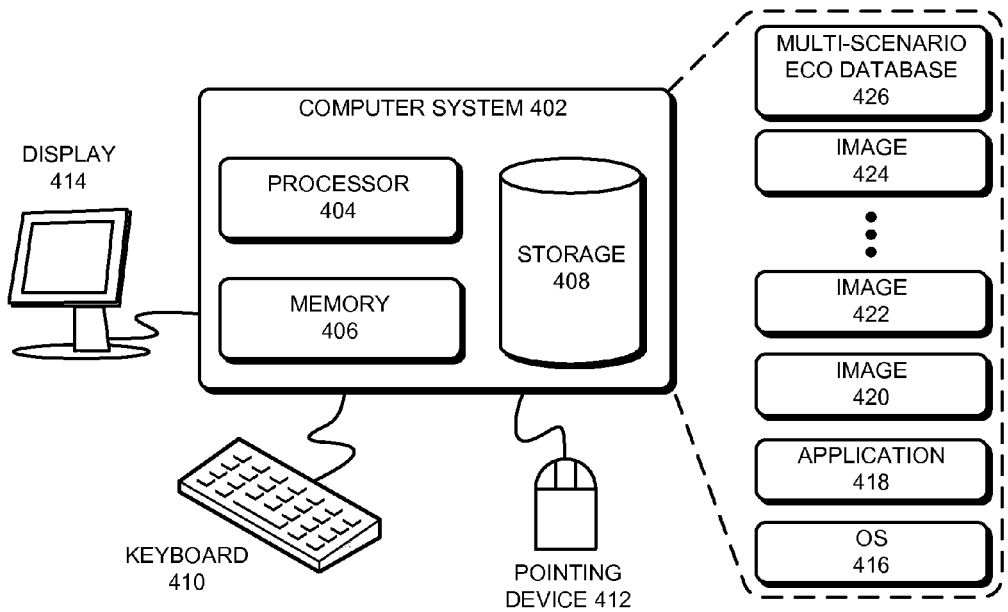
FIG. 4 illustrates an approach for fixing design requirement violations in multiple scenarios using a multi-scenario ECO database.

FIG. 4 illustrates an approach for fixing design requirement violations in multiple scenarios using a multi-scenario ECO database.

As in FIG. 3, computer system 402 can include processor 404, memory 406, and storage device 408. Computer system 402 can be coupled to display device 414, keyboard 410, and pointing device 412. Storage device 408 can store operating system 416, application 418, and scenario images 420-424 that correspond to different scenarios. Scenario images 420-424 can contain data that is required by application 418 to analyze, simulate, and/or fix design requirement violations in a circuit design in a particular scenario. Since each scenario image is typically very large, computer system 402 may only be able to hold one scenario image in memory 406 at any given time.

Storage 408 can additionally store multi-scenario ECO database 426. Multi-scenario ECO database 426 can include circuit information for multiple scenarios that can be used to estimate the impact of ECOs in multiple scenarios.

During operation, application 418 may load a scenario image corresponding to a particular scenario, e.g., scenario image 420 corresponding to scenario S1, from storage 408 into memory 406. Next, application 418 may load multi-scenario ECO database 426 into memory 406. Multi-scenario ECO database 426 can be small enough so that it can reside in memory 406 alongside scenario image 420. Application 418 may then use scenario image 420 to determine ECOs to fix design requirement violations in scenario S1, and use multi-scenario ECO database 426 to ensure that the ECOs are not expected to create new design requirement violations or worsen existing design requirement violations in other scenarios. Next, application 418 may either commit the determined ECOs to the circuit design, or store the ECOs in storage 408 so that the ECOs can be committed to the circuit design later. Application 418 substantially reduces the amount of time required to check the impact of ECOs in other scenarios because, unlike application 318 in FIG. 3, application 418 does not swap scenario images to check the impact of ECOs in other scenarios.

Once the ECOs for scenario S1 have either been committed or saved in storage 408, application 418 can load a second scenario image corresponding to another scenario. For example, application 418 can load scenario image 422 corresponding to scenario S2. Next, application 418 can use scenario image 422 to determine ECOs to fix design requirement violations in scenario S2, and use multi-scenario ECO database 426 to check the impact of the ECOs in other scenarios. In this manner, the system can determine ECOs to fix design requirement violations in each scenario and check the impact of the ECOs using the multi-scenario ECO database.

The embodiments shown in FIGS. 3 and 4 are for illustration purposes only. Various modifications to the embodiments will be readily apparent to those skilled in the art. For example, in one embodiment, computer system 402 may be part of a compute farm and not include any user interface devices, and application 418 may be submitted as a job to the compute farm. In another embodiment, computer 402 may be part of a cloud computing infrastructure.

Figures 5, 6:
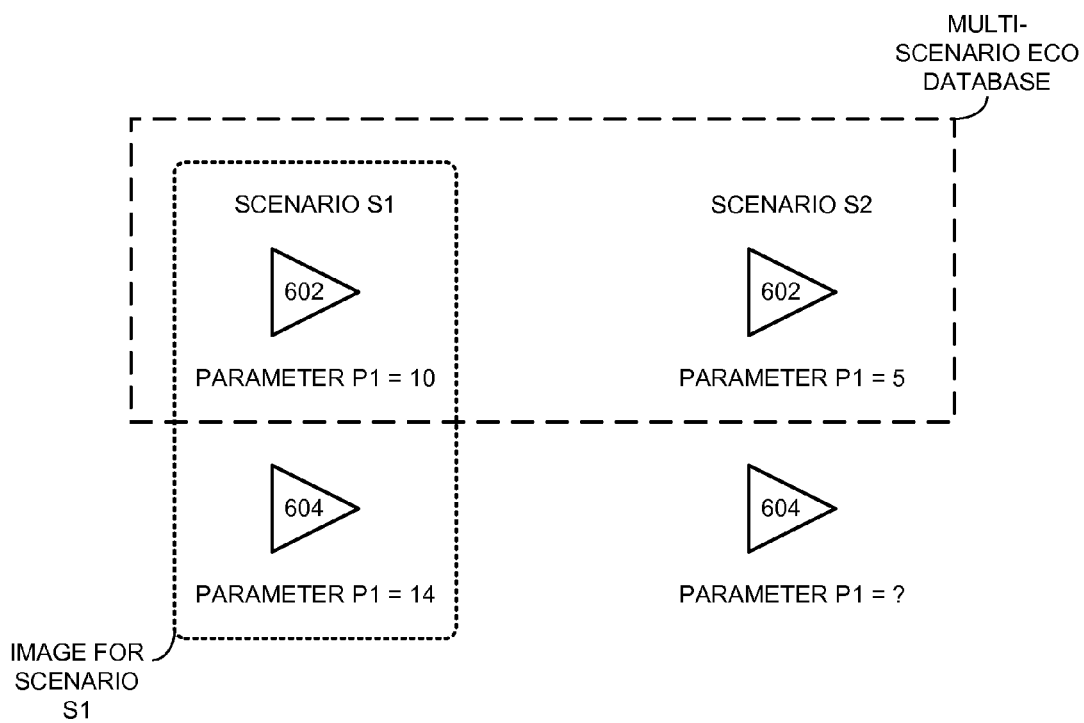
FIG. 5 illustrates a portion of a multi-scenario ECO database in a tabular format.
FIG. 6 illustrates an example of how parameter values can be estimated using a scenario image and a multi-scenario ECO database.

FIG. 5 illustrates a portion of a multi-scenario ECO database in a tabular format. Each row in table 500 can correspond to a scenario, and each column can correspond to a parameter, e.g., delay, capacitance, slew, etc. A multi-scenario ECO database can store parameter values for each object (e.g., gate, net, pin, etc.) of interest across all scenarios. Table 500 represents a portion of the multi-scenario ECO database that is associated with a particular object in the circuit design. For example, values V-501 through V-509 may be the parameter values associated with gate 208-S (see FIG. 2A) in different scenarios.

The information stored in a multi-scenario ECO database can be a small fraction of the information stored in a scenario image, e.g., scenario image 420 (see FIG. 4). Specifically, a multi-scenario ECO database may only store information for objects (e.g., gates, nets, pins, etc.) that are required for analyzing the impact of ECOs in different scenarios. For example, in FIGS. 2A and 2B, information about gate 214 does not need to be stored in a multi-scenario ECO database because gate 214 is neither on a setup timing violation path nor a hold timing violation path. Furthermore, a multi-scenario ECO database may be sparse, i.e., it may store values for only those scenarios and/or parameters that are required to analyze the impact of ECOs in different scenarios. For example, if gate 208-S in FIG. 2A is not expected to violate a static leakage power budget, then information about gate 208-S's static leakage power may not be stored in a multi-scenario ECO database. Similarly, if a circuit design does not have any design requirement violations in a particular scenario, and is also not expected to have any design requirement violations in that scenario, then the multi-scenario ECO database may not store any information for that scenario.

The information shown in table 500 may be associated with a particular gate. The system may replace a gate with a new gate to fix a design requirement violation. However, the current scenario image in memory and the multi-scenario ECO database may not have any information for the new gate. Therefore, some embodiments of the present invention use the current scenario image and the multi-scenario ECO database to estimate parameter values for replacement gates that are used for fixing design requirement violations.

For example, suppose table 500 stores parameter values for gate 208-S shown in FIG. 2A. Specifically, suppose parameter P1 in FIG. 5 corresponds to the gate delay of gate 208-S. Furthermore, suppose the system determines that replacing gate 208-S with gate 208-F will fix the two setup violations shown in FIG. 2A in scenario S1. The system may then want to check whether replacing gate 208-S with gate 208-F creates any problems in scenario S2. However, table 500 does not have parameter values (e.g., gate delays) for gate 208-F, and the image for scenario S1 does not have gate delay values for scenario S2.

FIG. 6 illustrates an example of how parameter values can be estimated using a scenario image and a multi-scenario ECO database.

Suppose the value of parameter P1 for gate 602 is equal to 10 and 5 in scenarios S1 and S2, respectively, and the value of parameter P1 for gate 604 is equal to 14 in scenario S1. The dashed box indicates the information that may be stored in multi-scenario ECO database, and the dotted box indicates the information that may be stored in an image for scenario S1. Note that the value of parameter P1 for gate 604 in scenario S2 is not stored in the image for scenario S1, and is also not stored in the multi-scenario ECO database.

The value of parameter P1 for gate 604 in scenario S2 may be required to determine whether replacing gate 602 with gate 604 is expected to create new design requirement violations or worsen existing design requirement violations in scenario S2. Some embodiments of the present invention estimate the value of parameter P1 for gate 604 in scenario S2 based on information contained in the image for scenario S1 and the multi-scenario ECO database.

In general, the system may use any estimation function to estimate the parameter values. In one embodiment, the system may determine a ratio between the values of parameter P1 for gate 602 in scenarios S1 and S2, and use the ratio to determine the value of parameter P1 for gate 604 in scenario S2. For example, in FIG. 6, the ratio between the values of parameter P1 for gate 602 in scenarios S1 and S2 is equal to 2. This ratio can then be used to determine the value of parameter P1 for gate 604 in scenario S2 to be 7.

Figure 7:
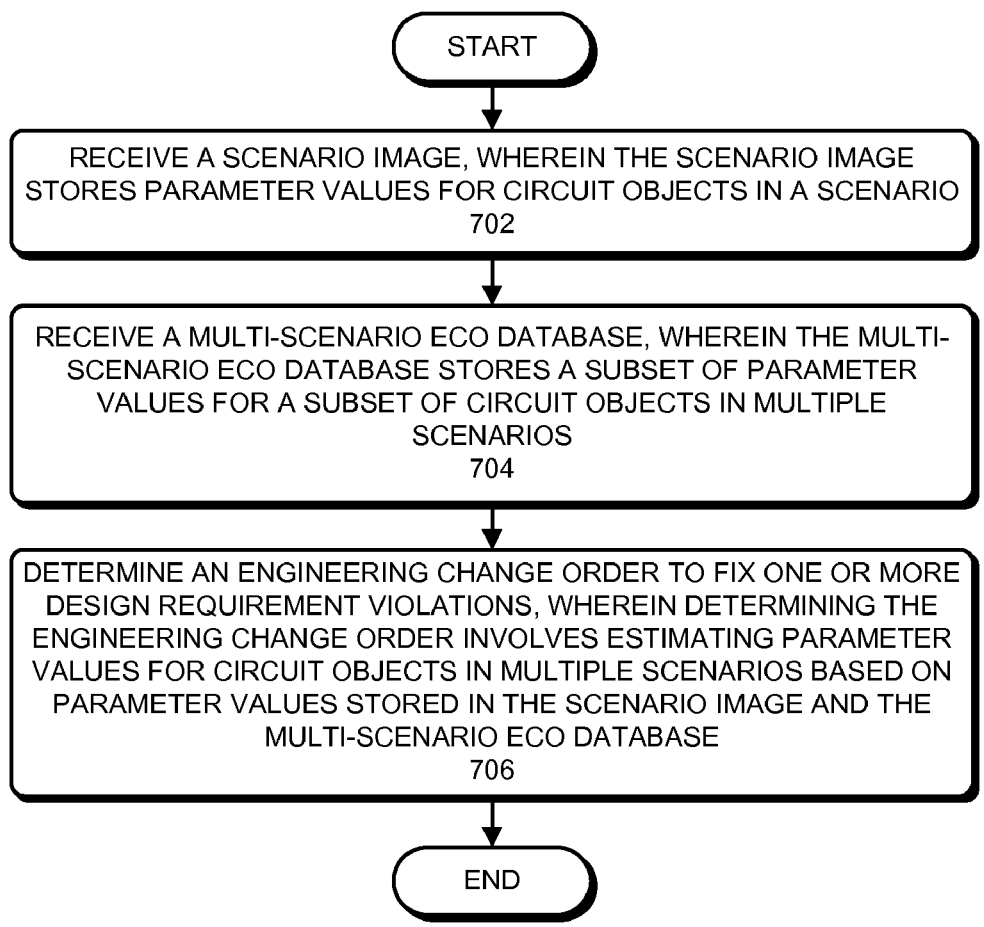
FIG. 7 presents a flowchart that illustrates a process for fixing design requirement violations in multiple scenarios.

FIG. 7 presents a flowchart that illustrates a process for fixing design requirement violations in multiple scenarios.

The process can begin by receiving a scenario image, wherein the scenario image stores parameter values for circuit objects in a scenario (operation 702).

A scenario can be associated with one or more of: a process corner, an operating condition, or an operating mode. A scenario image can include information that is used for performing detailed timing analysis and for checking compliance with various design requirements. As such, a scenario image can be very large, and a computer system may only be able to store a single scenario image in memory at any given time.

Parameter values can include, but are not limited to, timing slack values at one or more pins in the circuit design, leakage power values for gates in the circuit design, capacitive load values and transition time values at one or more pins in the circuit design. The following paragraphs describe some examples of design requirements and the associated parameter values and circuit objects. These examples are for illustration purposes only and are not intended to limit the scope of the present invention.

A "maximum delay timing" requirement (also known as a "setup time" requirement) requires a signal to arrive at a timing end-point before the required time associated with the timing end-point. If this design requirement is violated, the circuit design will most likely need to be operated at a slower speed. A timing end-point is an example of a circuit object that may need to meet this design requirement. The slack value at the timing end-point (e.g., the difference between the required time and the arrival time of a signal at the timing end-point) is an example of a parameter value that may need to be stored in a scenario image and/or a multi-scenario ECO database to determine whether or not an ECO fixes a violation of this design requirement. The magnitude of the slack value can be negative when the timing end-point violates this design requirement, and positive when the timing end-point satisfies the design requirement.

A "minimum delay timing" requirement (also known as a "hold time" requirement) requires a signal to arrive at a timing end-point after the required time. If this design requirement is violated, the circuit will most likely be inoperable and/or have incorrect functionality (e.g., because the signal was not captured by a register). A timing end-point is an example of a circuit object that may need to meet this design requirement. The slack value at the timing end-point (e.g., the difference between the required time and the arrival time of a signal at the timing end-point) is an example of a parameter value that may need to be stored in a scenario image and/or a multi-scenario ECO database to determine whether or not an ECO fixes a violation of this design requirement. The magnitude of the slack value can be negative when the timing end-point violates this design requirement, and positive when the timing end-point satisfies the design requirement.

An "electrical design rule" (also known as an electrical DRC) imposes one or more limits on one or more electrical properties of a circuit object. Examples of electrical design rules include: the maximum allowable signal transition time, the maximum allowable capacitive load on each gate, the maximum allowable fan-out of a net, and the maximum length of a net. An example of a parameter value that may need to be stored in a scenario image and/or a multi-scenario ECO database can be the electrical property value (e.g., the capacitance) of a circuit object. This design rule can apply to different types of circuit objects. For example, a maximum allowable signal transition time requirement can apply to a timing end-point or a gate (e.g., the transition at the output of the gate must be within some range), or a net (e.g., the transition on any pin on the net must be less than some value). A maximum allowable capacitive load requirement can apply to a logic gate. A maximum allowable fan-out requirement and/or a maximum length requirement can apply to a net.

A "power budget" constraint or requirement can impose one or more limits on one or more power-related properties of a circuit design. Examples of power-related design requirements include upper limits on the allowable leakage, dynamic, and/or total power of a circuit object. A parameter value that may be stored in a scenario image and/or a multi-scenario ECO database can be the power consumption value of a circuit object. This design requirement may apply to different types of circuit objects. For example, a power-related design requirement can be applied to the entire circuit design, or to each leaf-level cell instance in the circuit design, or to specific blocks in the circuit design.

Continuing with the discussion of FIG. 7, the system can then receive a multi-scenario ECO database, wherein the multi-scenario ECO database stores a subset of parameter values for a subset of circuit objects in multiple scenarios (operation 704). A multi-scenario ECO database stores various parameter values for circuit objects across multiple scenarios. However, since the multi-scenario ECO database may only need to store a subset of the parameter values for only a subset of the circuit objects, the multi-scenario ECO database can be substantially smaller in size when compared to a scenario image.

In some embodiments, the multi-scenario ECO database only stores a range of values for each parameter of interest. The range is selected so that a parameter value in any given scenario will fall within the range.

In some embodiments, the system builds a multi-scenario ECO database based on the known design requirement violations. For example, suppose a circuit design violates a certain number of design requirements. The system can determine the parameters and circuit objects that are implicated by the design requirement violations. Next, the system can store only these parameter values in the multi-scenario ECO database. For example, as shown in FIGS. 2A and 2B, parameter values associated with gate 214 may not be stored in a multi-scenario ECO database because gate 214 is on neither a setup timing violation path nor a hold timing violation path.

In some embodiments, the system builds a multi-scenario ECO database based on known design requirement violations as well as potential design requirement violations. For example, the system may consider parameter values that are not violating, but are close to violating. For example, parameter values associated with gate 214 may be stored in the multi-scenario ECO database if gate 214 is on a timing path whose slack is almost zero (i.e., it is close to violating a timing requirement).

Continuing with the discussion of FIG. 7, the system can then determine an engineering change order to fix one or more design requirement violations, wherein said determining includes estimating parameter values for circuit objects in multiple scenarios based on parameter values stored in the scenario image and the multi-scenario ECO database (operation 706).

Specifically, a scenario image may store parameter values for a first gate and a second gate in a first scenario. The multi-scenario ECO database may store a parameter value for the first gate in a second scenario. The system may then estimate a parameter value for the second gate in the second scenario based on parameter values stored in the scenario image and the multi-scenario ECO database.

CONCLUSION

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for fixing design requirement violations in a circuit design in multiple scenarios, the method comprising:
   receiving a scenario image, wherein the scenario image stores parameter values for circuit objects in a scenario;
   receiving a multi-scenario engineering change order (ECO) database, wherein the multi-scenario ECO database stores a subset of parameter values for a subset of circuit objects in the multiple scenarios; and
   determining, by using one or more processors, an ECO to fix one or more design requirement violations, wherein said determining includes estimating parameter values for circuit objects in at least some of the multiple scenarios based on parameter values stored in the scenario image and the multi-scenario ECO database.

2. The method of claim 1, wherein each scenario in the multiple scenarios is associated with one or more of: a process corner, an operating condition, or an operating mode.

3. The method of claim 1, wherein the parameter values include timing slack values at one or more pins in the circuit design.

4. The method of claim 1, wherein the parameter values include capacitive load values at one or more pins in the circuit design.

5. The method of claim 1, wherein the parameter values include transition time values at one or more pins in the circuit design.

6. The method of claim 1, wherein the parameter values include leakage power values for gates in the circuit design.

7. The method of claim 1, wherein the one or more design requirement violations include a setup timing violation.

8. The method of claim 1, wherein the one or more design requirement violations include a hold timing violation.

9. The method of claim 1, wherein the one or more design requirement violations include an electrical design rule violation.

10. The method of claim 1, wherein the one or more design requirement violations include a power budget violation.

11. A non-transitory computer-readable storage medium storing instructions that, when executed by a computer, cause the computer to perform a method for fixing design requirement violations in a circuit design in multiple scenarios, the method comprising:
   receiving a scenario image, wherein the scenario image stores parameter values for circuit objects in a scenario;
   receiving a multi-scenario engineering change order (ECO) database, wherein the multi-scenario ECO database stores a subset of parameter values for a subset of circuit objects in the multiple scenarios; and
   determining an ECO to fix one or more design requirement violations, wherein said determining includes estimating parameter values for circuit objects in at least some of the multiple scenarios using parameter values stored in the scenario image and the multi-scenario ECO database.

12. The non-transitory computer-readable storage medium of claim 11, wherein each scenario in the multiple scenarios is associated with one or more of: a process corner, an operating condition, or an operating mode.

13. The non-transitory computer-readable storage medium of claim 11, wherein the parameter values include timing slack values at one or more pins in the circuit design.

14. The non-transitory computer-readable storage medium of claim 11, wherein the parameter values include capacitive load values at one or more pins in the circuit design.

15. The non-transitory computer-readable storage medium of claim 11, wherein the parameter values include transition time values at one or more pins in the circuit design.

16. The non-transitory computer-readable storage medium of claim 11, wherein the parameter values include leakage power values for gates in the circuit design.

17. The non-transitory computer-readable storage medium of claim 11, wherein the one or more design requirement violations include a setup timing violation.

18. The non-transitory computer-readable storage medium of claim 11, wherein the one or more design requirement violations include a hold timing violation.

19. The non-transitory computer-readable storage medium of claim 11, wherein the one or more design requirement violations include an electrical design rule violation.

20. The non-transitory computer-readable storage medium of claim 11, wherein the one or more design requirement violations include a power budget violation.

21. A system, comprising:
- a processor; and
- a memory, storing:
  - a scenario image, wherein the scenario image stores parameter values for circuit objects in a scenario;
  - a multi-scenario engineering change order (ECO) database, wherein the multi-scenario ECO database stores a subset of parameter values for a subset of circuit objects in the multiple scenarios; and
  - instructions that, when executed by the processor, cause the system to determine an ECO to fix one or more design requirement violations, wherein said determining includes estimating parameter values for circuit objects in at least some of the multiple scenarios using parameter values stored in the scenario image and the multi-scenario ECO database.

22. The system of claim 21, wherein each scenario in the multiple scenarios is associated with one or more of: a process corner, an operating condition, or an operating mode.

23. The system of claim 21, wherein the parameter values include one or more of:
- timing slack values at one or more pins in the circuit design;
- capacitive load values at one or more pins in the circuit design;
- transition time values at one or more pins in the circuit design; and
- leakage power values for gates in the circuit design.

24. The system of claim 21, wherein the one or more design requirement violations include one or more of:
- a setup timing violation;
- a hold timing violation;
- an electrical design rule violation; and
- power budget violation.

* * * * *